US009263256B2

(12) United States Patent
Obu et al.

(10) Patent No.: US 9,263,256 B2
(45) Date of Patent: Feb. 16, 2016

(54) METHOD OF FORMING SEED LAYER, METHOD OF FORMING SILICON FILM, AND FILM FORMING APPARATUS

(71) Applicant: TOKYO ELECTRON LIMITED, Minato-ku, Tokyo (JP)

(72) Inventors: Tomoyuki Obu, Nirasaki (JP); Takahiro Miyahara, Nirasaki (JP); Tomoyuki Nagata, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 154 days.

(21) Appl. No.: 14/141,777

(22) Filed: Dec. 27, 2013

(65) Prior Publication Data

US 2014/0187024 A1  Jul. 3, 2014

(30) Foreign Application Priority Data

Dec. 27, 2012  (JP) ................. 2012-285701

(51) Int. Cl.

| C23C 16/24 | (2006.01) |
|---|---|
| H01L 21/02 | (2006.01) |
| C23C 16/02 | (2006.01) |
| C30B 25/02 | (2006.01) |
| C30B 25/18 | (2006.01) |
| C30B 29/06 | (2006.01) |

(52) U.S. Cl.
CPC ...... *H01L 21/02532* (2013.01); *C23C 16/0272* (2013.01); *C23C 16/24* (2013.01); *C30B 25/02* (2013.01); *C30B 25/18* (2013.01); *C30B 29/06* (2013.01); *H01L 21/0245* (2013.01); *H01L 21/0262* (2013.01); *H01L 21/02381* (2013.01); *H01L 21/02488* (2013.01); *H01L 21/02502* (2013.01)

(58) Field of Classification Search
CPC ............. H01L 21/02381; H01L 21/0245; H01L 21/02502; H01L 21/02532; H01L 21/0262; C30B 29/06; C30B 25/02; C30B 25/18; C30B 25/183; C23C 16/0272; C23C 16/24

See application file for complete search history.

(56) References Cited

U.S. PATENT DOCUMENTS

| 8,431,494 B2 * | 4/2013 | Murakami et al. ............ 438/770 |
|---|---|---|
| 8,455,369 B2 * | 6/2013 | Watanabe et al. ............ 438/763 |
| 8,685,832 B2 * | 4/2014 | Watanabe ..................... 438/427 |
| 8,722,510 B2 * | 5/2014 | Watanabe et al. ............ 438/431 |
| 8,802,547 B2 * | 8/2014 | Kakimoto et al. ............ 438/482 |
| 8,895,414 B1 * | 11/2014 | Kakimoto et al. ............ 438/482 |
| 8,945,339 B2 * | 2/2015 | Kakimoto et al. ....... 156/345.24 |
| 8,946,065 B2 * | 2/2015 | Okada et al. .................. 438/482 |
| 9,006,021 B2 * | 4/2015 | Hasebe et al. .................. 438/96 |

(Continued)

FOREIGN PATENT DOCUMENTS

| JP | 01-217956 A | 8/1989 |
|---|---|---|
| JP | 2011-249764 A | 8/2011 |

(Continued)

*Primary Examiner* — Mary Wilczewski
(74) *Attorney, Agent, or Firm* — Nath, Goldberg & Meyer; Jerald L. Myer

(57) ABSTRACT

Provided is a method of forming a seed layer as a seed of a thin film on an underlayer, which includes: forming a first seed layer on a surface of the underlayer by heating the underlayer, followed by supplying an aminosilane-based gas onto the surface of the heated underlayer; and forming a second seed layer on the surface of the underlayer with the first seed layer formed thereon by heating the underlayer, followed by supplying a disilane or higher order silane-based gas onto the surface of the heated underlayer.

11 Claims, 10 Drawing Sheets

(56) References Cited

U.S. PATENT DOCUMENTS

| | | | |
|---|---|---|---|
| 2011/0207302 A1* | 8/2011 | Wang et al. | 438/486 |
| 2011/0263105 A1* | 10/2011 | Hasebe et al. | 438/482 |
| 2011/0312192 A1* | 12/2011 | Murakami et al. | 438/787 |
| 2012/0028437 A1* | 2/2012 | Watanabe et al. | 438/425 |
| 2012/0103518 A1* | 5/2012 | Kakimoto et al. | 156/345.1 |
| 2012/0164842 A1* | 6/2012 | Watanabe et al. | 438/763 |
| 2013/0023110 A1* | 1/2013 | Kakimoto et al. | 438/482 |
| 2013/0052795 A1* | 2/2013 | Watanabe | 438/427 |
| 2013/0084693 A1* | 4/2013 | Kakimoto et al. | 438/482 |
| 2013/0109155 A1* | 5/2013 | Okada et al. | 438/478 |
| 2013/0109197 A1* | 5/2013 | Murakami et al. | 438/770 |
| 2013/0244399 A1* | 9/2013 | Okada | 438/455 |
| 2013/0264624 A1* | 10/2013 | Ishida et al. | 257/315 |
| 2014/0187024 A1* | 7/2014 | Obu et al. | 438/479 |
| 2014/0199853 A1* | 7/2014 | Murakami et al. | 438/770 |
| 2014/0342534 A1* | 11/2014 | Kakimoto et al. | 438/482 |
| 2015/0037970 A1* | 2/2015 | Hasebe et al. | 438/607 |
| 2015/0101532 A1* | 4/2015 | Okada et al. | 118/704 |
| 2015/0206795 A1* | 7/2015 | Hasebe et al. | |

FOREIGN PATENT DOCUMENTS

| | | |
|---|---|---|
| JP | 2012-109537 A | 6/2012 |
| JP | 2013-26513 A | 2/2013 |
| JP | 2013-82986 A | 5/2013 |
| JP | 2013-95945 A | 5/2013 |

* cited by examiner

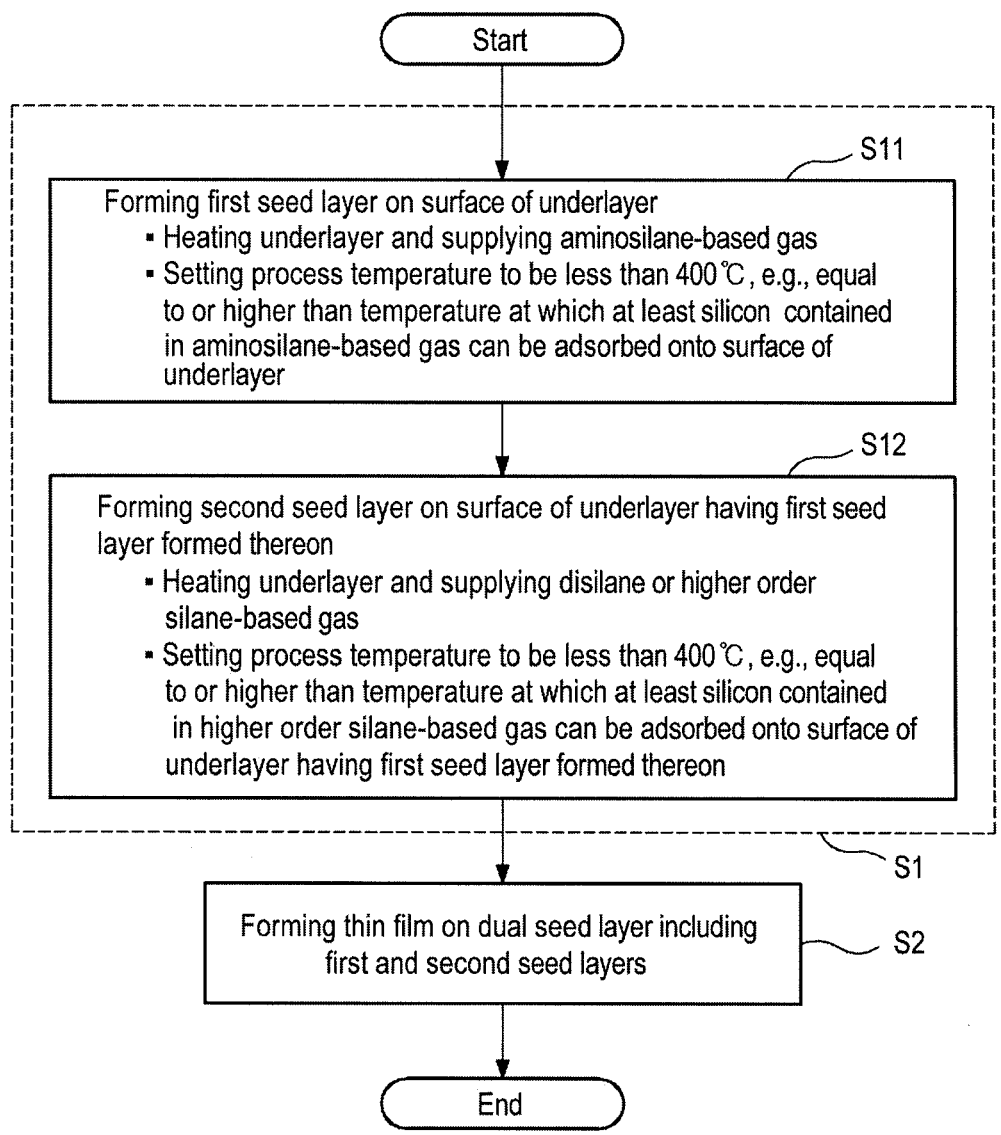

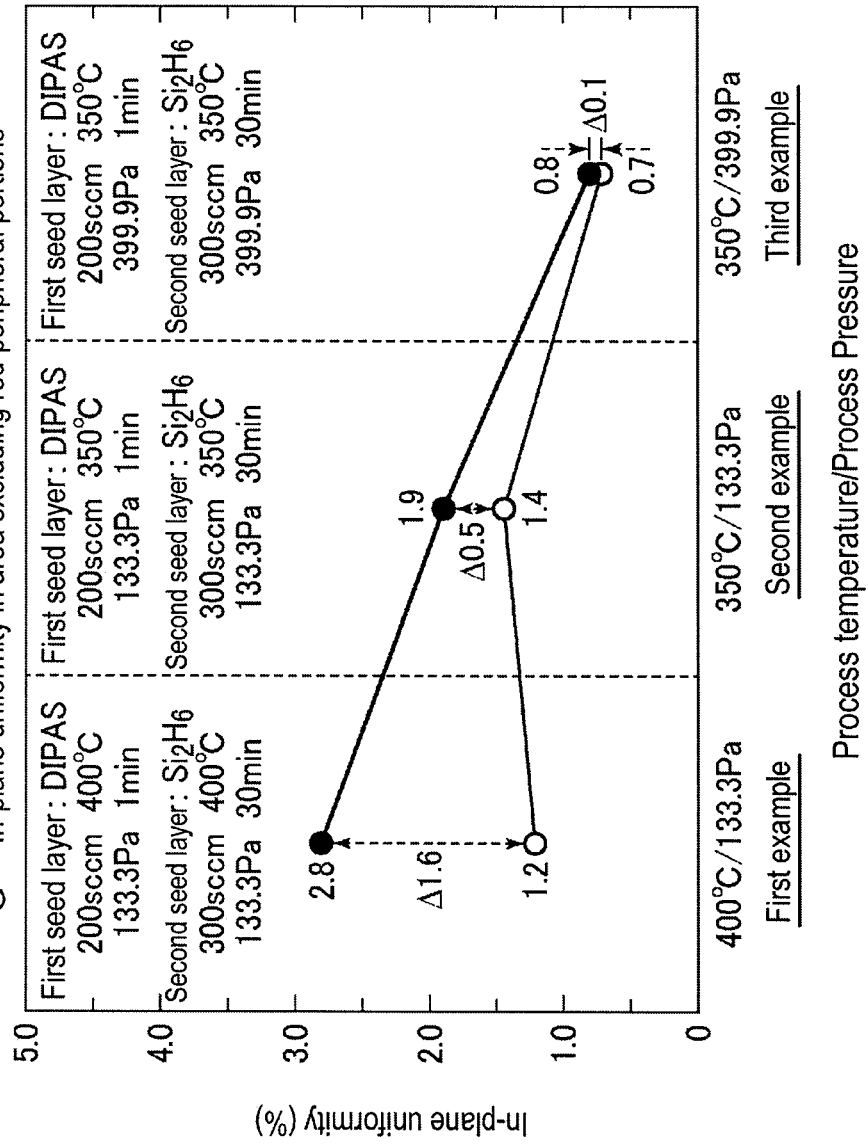

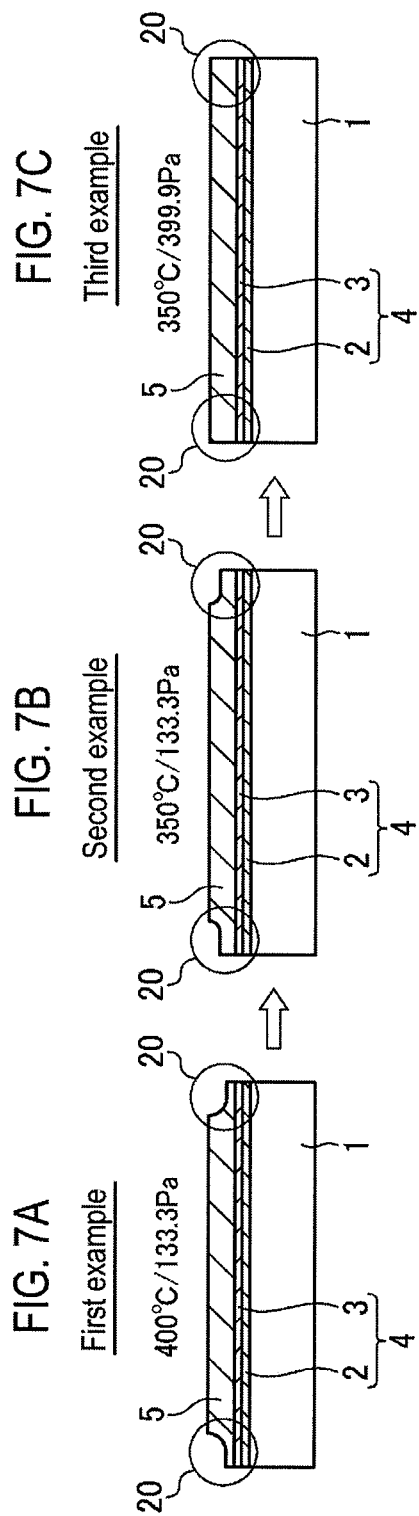

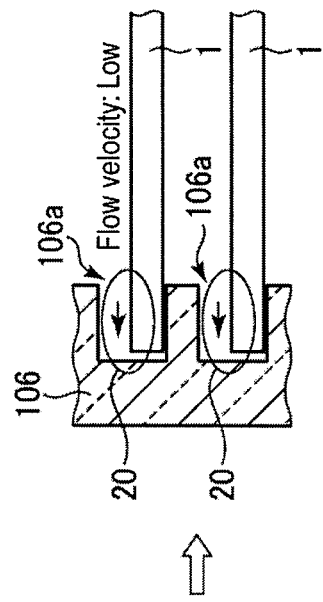
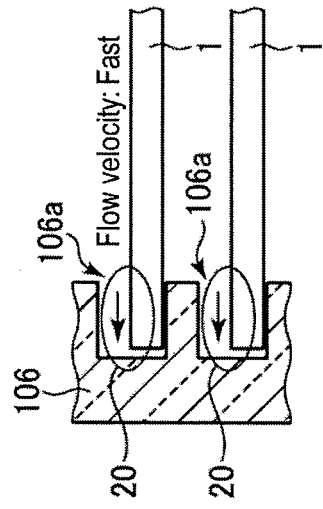

METHOD OF FORMING SEED LAYER, METHOD OF FORMING SILICON FILM, AND FILM FORMING APPARATUS

CROSS-REFERENCE TO RELATED APPLICATION

This application claims the benefit of Japanese Patent Application No. 2012-285701, filed on Dec. 27, 2012, in the Japan Patent Office, the disclosure of which is incorporated herein in its entirety by reference.

TECHNICAL FIELD

The present disclosure relates to a method of forming a seed layer, a method of forming a silicon film, and a film forming apparatus.

BACKGROUND

In a semiconductor integrated circuit device, silicon, for example, an amorphous silicon is used in filling a contact hole or line, or as a thin film material for forming a device or structure. There is known a technique for forming an amorphous silicon film by decomposing disilane at a temperature ranging from 400 to 500 degrees C., trisilane at a temperature ranging from 350 to 450 degrees C., or tetrasilane at a temperature ranging from 300 to 400 degrees C.

However, when a miniaturized contact hole or line is filled with the amorphous silicon, a film formed by the amorphous silicon has poor coverage in the contact hole (or line), which results in large voids. These large voids may cause, e.g., an increase in resistance. Also, this may cause degradation in accuracy of surface roughness of the amorphous silicon film.

In order to avoid a degradation of the accuracy of the surface roughness of the amorphous silicon film, there is also known an approach for supplying, before the formation of the amorphous silicon film, an aminosilane-based gas onto a surface of an underlayer such that a seed layer is formed on the surface.

In recent years, in addition to improving the accuracy of the surface roughness of the silicon film (e.g., the amorphous silicon film), further reduction in temperature of a film forming process is desired.

The aforementioned approach is capable of achieving an improvement to the accuracy of the surface roughness, but is mainly applied to a case where a temperature of the film forming process is equal to or more than 400 degrees C. For example, if the approach is applied to a film forming process having a temperature of less than 400 degrees C. (e.g., 350 degrees C.) as an upper limit, an incubation time of the amorphous silicon film that is formed on the seed layer is slightly increased.

This may result in a slight deterioration in the accuracy of the surface roughness. Such deterioration, although is not problematic as it now stands, may be elevated to an unacceptable level as the development of an electron device advances.

Accordingly, taking into account the further reduction in temperature of the film forming process, it is difficult to maintain or improve the accuracy of the surface roughness of the thin film formed on a seed layer, and to achieve further improvement of in-plane uniformity.

SUMMARY

Some embodiments of the present disclosure provide to a seed layer forming method, a silicon film forming method using the seed layer forming method, and a film forming apparatus for use in the silicon film forming method, which are capable of meeting a desired further reduction in temperature of a film forming process, maintaining or improving accuracy of surface roughness of a thin film formed on a seed layer, and achieving further improvement of in-plane uniformity of the thin film.

According to one embodiment of the present disclosure, provided is a method of forming a seed layer as a seed of a thin film on an underlayer, which includes: forming a first seed layer on a surface of the underlayer by heating the underlayer, followed by supplying an aminosilane-based gas onto the surface of the heated underlayer; and forming a second seed layer on the surface of the underlayer with the first seed layer formed thereon by heating the underlayer, followed by supplying a disilane or higher order silane-based gas onto the surface of the heated underlayer, wherein a process temperature applied when forming the first seed layer is set to be within a range between less than 400 degrees C. and not less than a temperature at which at least silicon contained in the aminosilane-based gas is adsorbed onto the surface of the underlayer, and wherein a process temperature applied in forming the second seed layer is set to be within a range between less than 400 degrees C. and not less than a temperature at which at least silicon contained in the disilane or higher order silane-based gas is adsorbed onto the surface of the underlayer with the first seed layer formed thereon.

According to another embodiment of the present disclosure, provided is a method of forming a silicon film on an object to be processed, which includes: forming a seed layer on a surface of an underlayer of the object to be processed; and forming the silicon film on the seed layer, wherein forming a seed layer is performed using the method according to the one embodiment.

According to another embodiment of the present disclosure, provided is an apparatus of forming a silicon film on an underlayer, which includes: a processing chamber configured to accommodate an object to be processed having the underlayer on which the silicon film is formed; a process gas supply mechanism configured to supply a process gas into the processing chamber; a heating mechanism configured to heat the object to be processed accommodated in the processing chamber; an exhaust mechanism configured to exhaust the processing chamber; and a controller configured to control the process gas supply mechanism, the heating mechanism and the exhaust mechanism to perform the method according to the another embodiment.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flowchart illustrating an example of sequences of a seed layer forming method and a silicon film forming method using the same, according to first and second embodiments of the present disclosure.

FIG. 5 is a view illustrating a relationship between process temperature/process pressure when forming a seed layer and in-plane uniformity of a silicon film.

FIGS. 7A to 7C are horizontal sectional views schematically showing a relationship between a change in process temperature/process pressure and a change in thickness of the silicon film.

FIGS. 8A and 8B are longitudinal sectional views schematically showing a relationship between a change in process temperature/process pressure and a change in flow velocity of a process gas in support grooves.

DETAILED DESCRIPTION

Figure 2A:
FIGS. 2A to 2D are cross sectional views schematically showing states of a semiconductor substrate during the sequences.

Hereinafter, embodiments of the present disclosure will be described with reference to the drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. In addition, throughout the drawings, like reference numerals are used to designate like elements.

FIG. 1 is a flowchart illustrating an example of sequences of a seed layer forming method and a silicon film forming method using the same, according to first and second embodiments of the present disclosure. FIGS. 2A to 2D are cross sectional views schematically showing states of a semiconductor substrate during the sequences.

First, as shown in FIG. 2A, a silicon substrate (silicon wafer) 1 in the first embodiment is prepared as an object to be processed. In the first embodiment, the silicon substrate 1 is shown as an underlayer on which a silicon film (i.e., a single crystal silicon) is formed, but is not limited to the single crystal silicon. In some embodiments, the underlayer may be oxidized at its surface. Further, a thin film such as a silicon oxide film, a silicon nitride film, a metal film, a metal oxide film, a metal nitride film or the like, may be deposited on the oxidized surface of the underlayer.

Subsequently, as shown in operation S1 of FIG. 1, a seed layer is formed on the underlayer, i.e., the silicon substrate 1 in the first embodiment. Further in the first embodiment, the seed layer is formed through two steps. An example of a method of forming the seed layer is as follows.

<Formation of First Seed Layer>

Figure 2B:
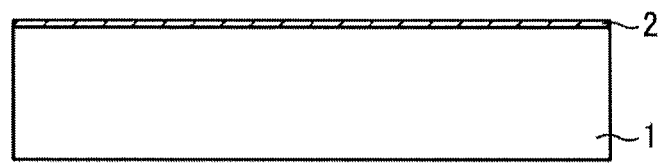

As shown in operation S11 of FIG. 1 and FIG. 2B, the silicon substrate 1 (used as the underlayer) is heated, and subsequently, an aminosilane-based gas is supplied onto the surface of the silicon substrate 1 such that at least silicon contained in the aminosilane-based gas is adsorbed onto the surface of the silicon substrate 1. In addition, a process temperature in operation S11 is set to be within a range between less than 400 degrees C. and equal to or more than a temperature at which at least the silicon contained in the aminosilane-based gas can be adsorbed onto the surface of the underlayer (i.e., the silicon substrate 1 in the first embodiment). Thus, a first seed layer 2 is formed on the surface of the silicon substrate 1 (used as the underlayer).

An example of the aminosilane-based gas may include a gas containing at least one selected from a group consisting of:

butylaminosilane (BAS),
bis(tertiary-butylamino)silane (BTBAS),
dimethylaminosilane (DMAS),
bis(dimethylamino)silane (BDMAS),
tri(dimethylamino)silane (TDMAS),
diethylaminosilane (DEAS),
bis(diethylamino)silane (BDEAS),
dipropylaminosilane (DPAS),
diisopropylaminosilane (DIPAS), and
hexakis(ethylamino)disilane:

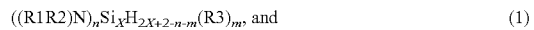
$$((R1R2)N)_n Si_X H_{2X+2-n-m} (R3)_m, \text{ and} \quad (1)$$

$$((R1R2)N)_n Si_X H_{2X-n-m} (R3)_m. \quad (2)$$

In the chemical formulas (1) and (2) above, n is the number of amino groups, which is a natural number of 1 to 6, m is the number of alkyl groups, which is zero or a natural number of 1 to 5,

R1, R2, R3=$CH_3$, $C_2H_5$, $C_3H_7$,

R1, R2 and R3 may be equal to each other, or may not be equal to each other.

R3 may be Cl or F.

X is a natural number of equal to or greater than one

In the first embodiment, DIPAS was used as the aminosilane-based gas. An example of process conditions applied in the formation of the first seed layer 2 is as follows:

DIPAS Flow Rate: 200 sccm
Process Time: 1 min
Process Temperature: 350 degrees C.
Process Pressure: 133.3 Pa (1 Torr)
Herein, 1 Torr is defined as 133.3 Pa.

By performing the film forming process under these process conditions, a component containing at least silicon contained in DIPAS is adsorbed onto the surface of the silicon substrate 1, thus forming the first seed layer 2 on which the silicon is adsorbed at an atomic layer level, e.g., a level of one atomic layer (as the order of a monoatomic layer). The first seed layer 2 is a very thin layer and is formed without involving, e.g., a chemical vapor deposition (CVD) reaction.

<Formation of Second Seed Layer>

Figure 2C:
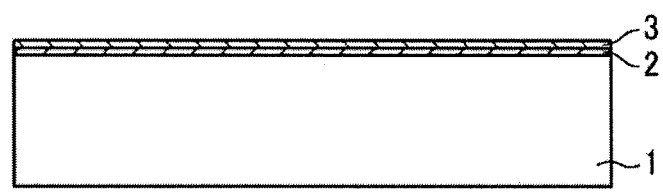

Subsequently, as shown in operation S12 of FIG. 1 and FIG. 2C, the silicon substrate 1 (used as the underlayer) is heated and then, a disilane or higher order silane-based gas containing no amino groups is supplied onto the surface of the heated silicon substrate 1 such that at least silicon contained in the disilane or higher order silane-based gas is adsorbed onto the surface of the silicon substrate 1 with the first seed layer 2 formed thereon. In addition, a process temperature in operation S12 is set to be within a range between less than 400 degrees C. and equal to or more than a temperature at which at least the silicon contained in the disilane or higher order silane-based gas can be adsorbed onto the surface of the silicon substrate 1 (used as the underlayer) with the first seed layer 2 formed thereon. Thus, a second seed layer 3 is formed on the surface of the silicon substrate 1 (used as the underlayer) followed by the first seed layer 2.

An example of the disilane or higher order silane-based gas containing no amino groups may include gas containing at least one selected from a group consisting of:

Silicon hydride which is represented by formula $Si_mH_{2m+2}$ (wherein m is a natural number equal to or greater than 2), and Silicon hydride which is represented by formula $Si_nH_{2n}$ (wherein n is a natural number equal to or greater than 3).

An example of the silicon hydride represented by the formula $Si_mH_{2m+2}$ may include at least one selected from a group consisting of:

Disilane ($Si_2H_6$),
Trisilane ($Si_3H_8$),
Tetrasilane ($Si_4H_{10}$),
Pentasilane ($Si_5H_{12}$),
Hexasilane ($Si_6H_{14}$), and
Heptasilane ($Si_7H_{16}$).

In addition, an example of the silicon hydride represented by the formula $Si_nH_{2n}$ may include at least one selected from a group consisting of:

Cyclotrisilane ($Si_3H_6$),
Cyclotetrasilane ($Si_4H_8$),
Cyclopentasilane ($Si_5H_{10}$),
Cyclohexasilane ($Si_6H_{12}$), and
Cycloheptasilane ($Si_7H_{14}$).

In the first embodiment, a disilane ($Si_2H_6$) gas was used as the disilane or higher order silane-based gas containing no amino groups. An example of process conditions applied in the formation of the second seed layer 3 is as follows:

$Si_2H_6$ Flow Rate: 300 sccm
Process Time: 60 min
Process Temperature: 350 degrees C.
Process Pressure: 399.9 Pa (3 Torr).

By performing the film forming process under these process conditions, a component containing at least silicon contained in the $Si_2H_6$ gas is adsorbed onto the surface of the silicon substrate 1 with the first seed layer 2 formed thereon, thus forming the second seed layer 3 on which the silicon is adsorbed at an atomic layer level, e.g., a level of one atomic layer (as the order of a monoatomic layer), or is adsorbed to have a thickness of 1 nm, similar to the first seed layer 2. Similar to the first seed layer 2, the second seed layer 3 is formed without involving, e.g., the CVD reaction.

In this way, according to the first embodiment, a dual seed layer 4 including the first seed layer 2 followed by the second seed layer 3 is formed as the seed layer. The dual seed layer 4 is in, e.g., an amorphous state. Thereafter, a thin film is formed on the dual seed layer 4. Accordingly, in the light of the sum of a thickness of the dual seed layer 4 and that of the thin film to be formed thereon, it is preferable that the dual seed layer 4 is formed to have a thickness in a range between more than zero and equal to or less than 1 nm.

<Formation of Thin Film>

Figure 2D:
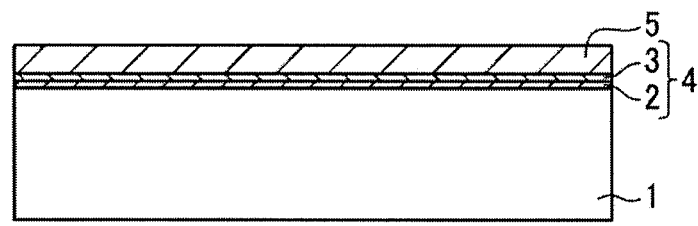

Subsequently, as shown in operation S2 of FIG. 1 and FIG. 2D, a silicon film 5 as the thin film is formed on the dual seed layer 4 including the first seed layer 2 followed by the second seed layer 3. An amino group-free silane-based gas is used as a raw material gas of the silicon film 5. An example of the amino group-free silane-based gas may include gas containing at least one selected from a group consisting of:

Silicon hydride which is represented by formula $Si_mH_{2m+2}$ (wherein m is a natural number of 1 or greater), and Silicon hydride which is represented by formula $Si_nH_{2n}$ (wherein n is a natural number of 3 or greater).

In addition, an example of the silicon hydride represented by the formula $Si_mH_{2m+2}$ may include monosilane ($SiH_4$) or the silicon hydride used in forming the second seed layer 3.

Further, an example of the silicon hydride represented by the formula $Si_nH_{2n}$ may include the silicon hydride used in forming the second seed layer 3.

In the second embodiment, a disilane ($Si_2H_6$) gas was used as the amino group-free silane-based gas. An example of process conditions applied in the formation of the silicon film 5 is as follows:

$Si_2H_6$ Flow Rate: 100 sccm
Process Time: 90 min
Process Temperature: 350 degrees C.
Process Pressure: 133.3 Pa (1 Torr).

Under the process conditions, the silicon film 5 having a thickness of, e.g., about 15 nm, is formed on the second seed layer 3 of the dual seed layer 4.

A chemical vapor deposition (CVD) method or an atomic layer deposition (ALD) method may be used in forming the silicon film 5.

In some embodiments, the silicon film 5 may be doped with a dopant. When the silicon film 5 is doped with the dopant, in the film forming process shown in operation S2 of FIG. 1 and FIG. 2D, a dopant-containing gas may be supplied together with the amino group-free silane-based gas.

An example of the dopant may include:

Boron (B),
Phosphorus (P),
Arsenic (As),
Oxygen (O),
Carbon (C), and
Nitrogen (N).

These dopants may be mixed with each other. Specifically, the silicon film 5 may be doped with the dopant by supplying a gas containing at least one selected from a group consisting of six kinds of the dopants together with the amino group-free silane-based gas in the film forming process shown in operation S2.

A state after the silicon film 5 is formed is any one of the followings:

Amorphous state,
Mixed amorphous and nanocrystalline state,
Nanocrystalline state, and
Polycrystalline state.

The state after the formation of the silicon film 5 may be determined in the course of forming the silicon film 5, or may be determined by a process that is performed after the formation of the silicon film 5. For example, in a case where the state is determined in the course of forming the silicon film 5, it may be determined by adjusting a process temperature, a process pressure, a flow rate of a raw material gas and the like. In a case where the state is determined after the formation of the silicon film 5, it may be determined by performing an annealing process onto the silicon substrate 1 with the silicon film 5 formed thereon. Specifically, the silicon film 5 may be controlled to be in any one of the aforementioned four states by adjusting the process temperature, the process pressure, the process time and the like in the annealing process.

The silicon film 5 is a thin film that is intended to be originally formed. Therefore, a thickness of the silicon film 5 can be determined by a user's request. From a practical viewpoint, the thickness of the silicon film 5 may fall within the range of more than 0 nm to 100 nm.

In this way, the silicon film 5 is formed on the silicon substrate 1 with the dual seed layer 4 including the first seed layer 2 followed by the second seed layer 3 interposed therebetween.

According to the silicon film forming method of the second embodiment, which uses the seed layer forming method of the first embodiment, the following effects are possible.

(Incubation Time)

First, in a case where the upper limit of the temperature of the film forming process is set to be less than 400 degrees C., an incubation time of the silicon film 5 will be described.

Figure 3:
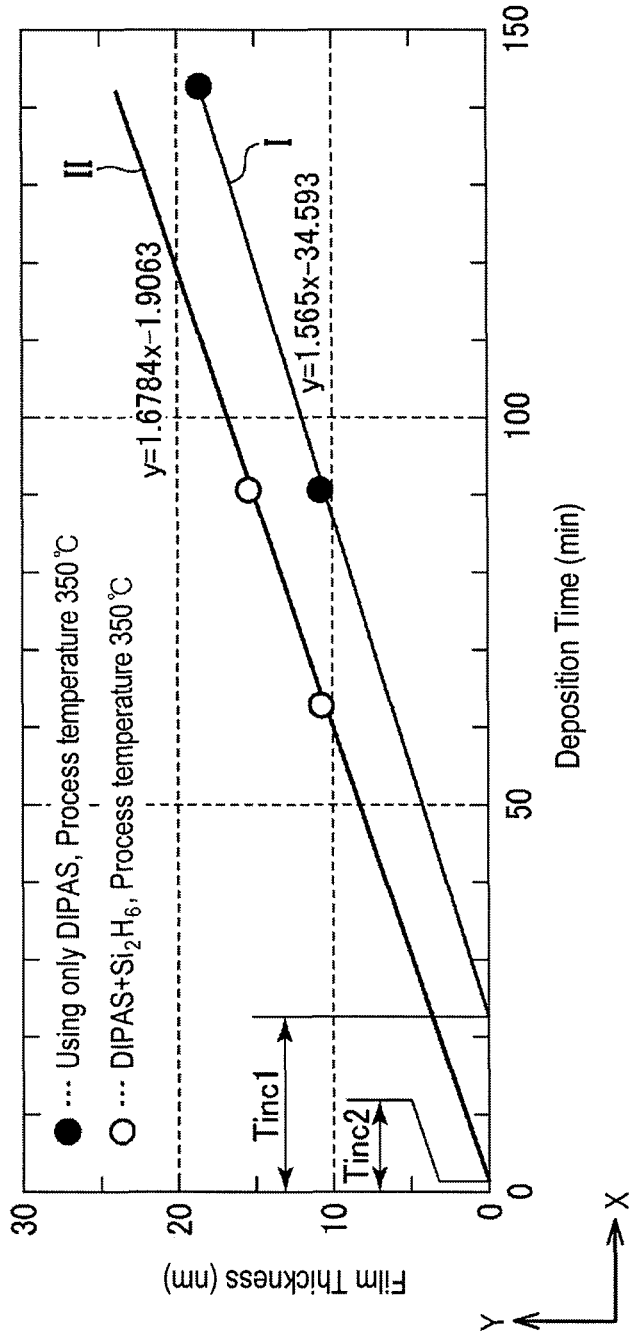
FIG. 3 is a view illustrating a relationship between a deposition time and a film thickness of a silicon film.

FIG. 3 is a view illustrating a relationship between a deposition time and a film thickness of the silicon film 5, with the deposition time as an X-axis and the film thickness as a Y-axis.

In FIG. 3, a reference example in which the upper limit of the temperature of the film forming process was set to be 350 degrees C., a single seed layer was formed using only DIPAS, and a silicon film was formed on the single seed layer, is shown as indicated by "●". In the reference example, an example of process conditions applied in forming the single seed layer is as follows:

DIPAS Flow Rate: 500 sccm
Process Time: 0.5 min
Process Temperature: 350 degrees C.
Process Pressure: 53.3 Pa (0.4 Torr)

As can be seen from the reference example of FIG. 3, the silicon film was formed to have a thickness of about 11 nm in the film forming process with a duration of about 90 min, and about 18 nm for a duration of about 143 min. A linear equation Line I obtained by linearly approximating these two thicknesses using a least square method is given as follows:

$$\text{Line I: } y = 1.565x - 34.593 \qquad \text{Eq. (1)}$$

In Eq. (1), for y=0 (i.e., the film thickness of the silicon film is zero), an intersection point of line I with the deposition time was measured as about 22 min. Thus, in the reference example, an incubation time Tinc1 of the silicon film is about 22 min.

Next, in a case where the silicon film 5 is formed on the dual seed layer 4 including the first seed layer 2 followed by the second seed layer 3 under the process conditions of operations S11 and S12 shown in FIG. 1 according to the first and second embodiments (as indicated by "○"), the silicon film 5 was formed to have a thickness of about 11 nm in the film forming process with a duration of about 63 min, and about 15 nm for a duration of about 90 min. A linear equation Line II obtained by linearly approximating these two thicknesses using the least square method is given as follows:

$$\text{Line II: } y = 1.6784x - 1.9063 \qquad \text{Eq. (2)}$$

In Eq. (2), for y=0 (i.e., the film thickness of the silicon film is zero), an intersection point of line II with the deposition time was measured as about 1.1 min. Thus, according to the first and second embodiments, an incubation time Tinc2 of the silicon film 5 is about 1.1 min.

As described above, according to the first and second embodiments, when the temperature of the film forming process is less than 400 degrees C. (e.g., 350 degrees C.) it is possible to shorten the incubation time of the silicon film 5 compared to the case where only the single seed layer is formed using the DIPAS. This makes it possible to further reduce the temperature of the film forming process.

Further, according to the first and second embodiments, the shortening of the incubation time as described above makes it possible to maintain and achieve further improvements in accuracy of the surface roughness of the thin film (i.e., the silicon film 5 in the second embodiment), which is formed on the dual seed layer 4, compared to the case where only the single seed layer is formed using the DIPAS.

(In-Plane Uniformity)

Next, in-plane uniformity of the silicon film 5 will be described in a case where the upper limit of the temperature of the film forming process is set to be less than 400 degrees C.

Figure 4A:
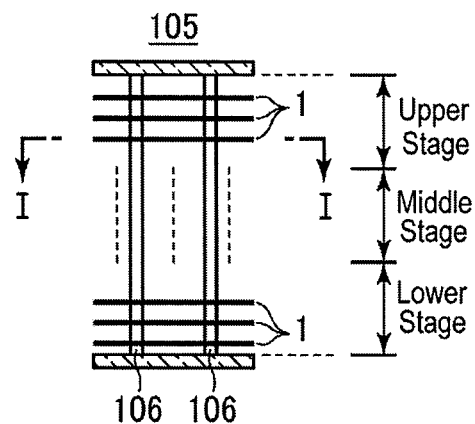
FIG. 4A is a longitudinal sectional view of a vertical wafer boat.
Figure 4B:
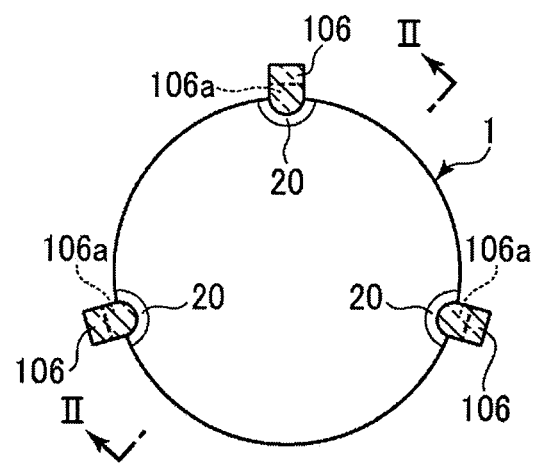
FIG. 4B is a horizontal sectional view of the vertical wafer boat.

FIG. 4A is a longitudinal sectional view of a vertical wafer boat, and FIG. 4B is a horizontal sectional view taken along line I-I of FIG. 4A. In addition, the longitudinal sectional view of FIG. 4A is taken along line II-II of FIG. 4B.

As shown in FIG. 4A, a vertical wafer boat 105 is made of, e.g., quartz, and includes a plurality of (e.g., three) boat rods 106. Each of the boat rods 106 has a plurality of support grooves 106a formed therein. Some portions at the periphery of each of the silicon substrates 1 are supported by respective ones of the plurality of support grooves 106a so that the silicon substrates 1 are loaded onto the vertical wafer boat 105 in multiple stages. The vertical wafer boat 105 having the silicon substrates 1 loaded thereon in multiple stages is inserted into a processing chamber of a film forming apparatus (which will be described later). Inside the processing chamber, the silicon film is formed using the seed layer forming method and the silicon film forming method according the above embodiments.

As described above, the silicon substrates 1 are loaded onto the vertical wafer boat 105 with the portions at the periphery of each of the silicon substrates 1 supported by the respective support grooves 106a. Above the portions (hereinafter, referred to as "rod peripheral portions 20") supported by the support grooves 106a in the silicon substrate 1, the boat rods 106 are disposed, unlike the central portion of the silicon substrate 1. Such an arrangement causes a difference in flow of a process gas between the rod peripheral portions 20 and an area (including the central portion except the rod peripheral portions 20) in the silicon substrate 1 in the course of the film forming process.

Therefore, an examination can be performed to check a relationship between a process temperature/process pressure and an in-plane uniformity of the silicon film 5 in the formation of the dual seed layer 4. FIG. 5 is a view illustrating the relationship between the process temperature/process pressure and the in-plane uniformity of the silicon film 5 in the formation of the dual seed layer 4. In FIG. 5, "●" represents the in-plane uniformity of the silicon film 5 over the entire in-plane area of the silicon substrate 1 (see FIG. 6A), and "○" represents the in-plane uniformity of the silicon film 5 in the area excluding the rod peripheral portions 20 in the silicon substrate 1 (see FIG. 6B).

First Example

Process Temperature of 400 degrees C./Process Pressure of 133.3 Pa

This first example is a case where the process temperature and the process pressure is basically set to be 400 degrees C. and 133.3 Pa (1 Torr), respectively. An example of specific process conditions applied to the first example is as follows. Also, the silicon film 5 was formed at a film forming temperature of 400 degrees C.

<Process Conditions for Formation of First Seed Layer 2>
Process Gas: DIPAS
Flow Rate of Process Gas: 200 sccm
Process Time: 1 min
Process Temperature: 400 degrees C.
Process Pressure: 133.3 Pa (1 Torr)

<Process Conditions for Formation of Second Seed Layer 3 (=Silicon Film 5)>

This process corresponds to the formation of the second seed layer 3 in the first embodiment. For the process temperature of 400 degrees C., disilane ($Si_2H_6$) is thermally decomposed. Thus, in the first example, silicon is grown by a chemical vapor deposition reaction so that the silicon film 5 is formed.

Process Gas: $Si_2H_6$
Flow Rate of Process Gas: 300 sccm
Process Time: 30 min
Process Temperature: 400 degrees C.
Process Pressure: 133.3 Pa (1 Torr)

Figure 6A:
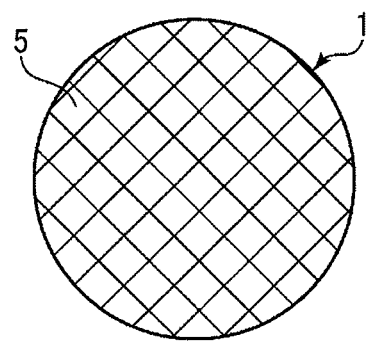
FIG. 6A is a plane view showing in-plane uniformity of a silicon film over an entire in-plane area of a semiconductor substrate.
Figure 6B:
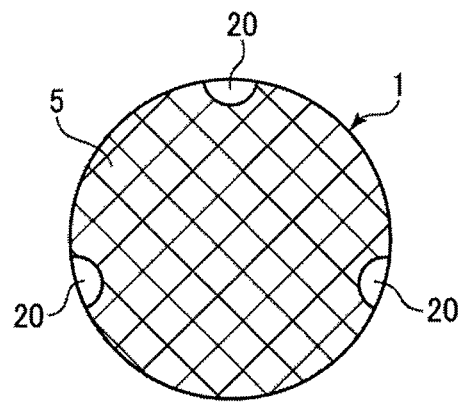
FIG. 6B is a plane view showing in-plane uniformity of the silicon film over an area excluding rod peripheral portions of the semiconductor substrate.

As shown in FIG. 5, in the first example, the in-plane uniformity in film thickness of the silicon film 5 over the entire in-plane area shown in FIG. 6A is about 2.8%. In addition, the in-plane uniformity in film thickness of the silicon film 5 over the area excluding the rod peripheral portions 20 shown in FIG. 6B is about 1.2%. Thus, a difference therebetween is about 1.6%. This shows that the film thicknesses of the silicon film 5 in the rod peripheral portions 20 are significantly different from that of the silicon film 5 in the area excluding the rod peripheral portions 20. That is, the film thicknesses of the silicon film 5 in the rod peripheral portions 20 have a tendency to be thinner than that of the silicon film 5 in the area excluding the rod peripheral portions 20.

Second Example

Process Temperature of 350 degrees C./Process Pressure of 133.3 Pa

This second example is a case where the process temperature is lowered from 400 degrees C. to 350 degrees C. while the process pressure is maintained at the same level as that of the first example. An example of specific process conditions applied to the second example is as follows. Also, the silicon film 5 was formed at a film forming temperature of 350 degrees C.

<Process Conditions for Formation of First Seed Layer 2>
Process Gas: DIPAS
Flow Rate of Process Gas: 200 sccm
Process Time: 1 min
Process Temperature: 350 degrees C.
Process Pressure: 133.3 Pa (1 Torr).

<Process Conditions for Formation of Second Seed Layer 3>
Process Gas: $Si_2H_6$
Flow Rate of Process Gas: 300 sccm
Process Time: 30 min
Process Temperature: 350 degrees C.
Process Pressure: 133.3 Pa (1 Torr).

As shown in FIG. 5, in the second example, the in-plane uniformity in film thickness of the silicon film 5 over the entire in-plane area is about 1.9%. In addition, the in-plane uniformity in film thickness of the silicon film 5 over the area excluding the rod peripheral portions 20 is about 1.4%. Thus, a difference therebetween is about 0.5%. This shows that a difference between the film thickness of the silicon film 5 in the rod peripheral portions 20 and the film thickness of the silicon film 5 in the area excluding the rod peripheral portions 20 is reduced compared to the first example in which the process temperature is 400 degrees C. and the process pressure is 133.3 Pa, thus resulting in an improved in-plane uniformity in film thickness. That is, by lowering the process temperature to less than 400 degrees C., it is possible to improve the in-plane uniformity in film thickness of the silicon film 5.

Third Example

Process Temperature of 350 Degrees C./Process Pressure of 399.9 Pa

A third example is a case where the process pressure is elevated from 133.3 Pa (1 Torr) to 399.9 Pa (3 Torr) while the process temperature is maintained at the same level as that of the second example. An example of specific process conditions applied to the third example is as follows. Also, the silicon film 5 was formed at a film forming temperature of 350 degrees C.

<Process Conditions for Formation of First Seed Layer 2>
Process Gas: DIPAS
Flow Rate of Process Gas: 200 sccm
Process Time: 1 min
Process Temperature: 350 degrees C.
Process Pressure: 399.9 Pa (3 Torr).

<Process Conditions for Formation of Second Seed Layer 3>
Process Gas: $Si_2H_6$
Flow Rate of Process Gas: 300 sccm
Process Time: 30 min
Process Temperature: 350 degrees C.
Process Pressure: 399.9 Pa (3 Torr).

As shown in FIG. 5, in the third example, the in-plane uniformity in film thickness of the silicon film 5 over the entire in-plane area is about 0.8%. In addition, the in-plane uniformity in film thickness of the silicon film 5 over the area excluding the rod peripheral portions 20 is about 0.7%. Thus, a difference therebetween is about 0.1%. This shows that a difference between the film thickness of the silicon film 5 in the rod peripheral portions 20 and the film thickness of the silicon film 5 in the area excluding the rod peripheral portions 20 is further reduced compared to the second example in which the process temperature is 350 degrees C. and the process pressure is 133.3 Pa. As a result, further improved in-plane uniformity can be attained in film thickness. That is, by lowering the process temperature to less than 400 degrees C. and setting the process pressure to be more than 133.3 Pa, it is possible to further improve the in-plane uniformity in film thickness of the silicon film 5. In the third example in which the process temperature is 350 degrees C. and the process pressure is 399.9 Pa, the difference between the film thicknesses is about 0.1% as described above. This shows that the film thickness of the silicon film 5 in the rod peripheral portions 20 and the film thickness of the silicon film 5 in the area excluding the rod peripheral portions 20 are rarely different from each other.

In short, according to the second example having the process conditions such as the process temperature of less than 400 degrees C. (e.g., 350 degrees C.) and the process pressure of 133.3 Pa (see FIG. 7B), it is possible to form the silicon film 5 to have a relatively thick thickness in the rod peripheral portions 20, as compared with the first example having the process conditions such as the process temperature of 400 degrees C. and the process pressure of 133.3 Pa (see FIG. 7A). This improves the in-plane uniformity of the silicon film 5. In other words, the first example suffers in that, as described above, for the process temperature of 400 degrees C., the disilane ($Si_2H_6$) is thermally decomposed so that the second seed layer 3 (i.e., silicon contained in the disilane) is grown by the CVD reaction, which allows the silicon film 5 to be formed thick in the area excluding the rod peripheral portions 20.

In consideration of this point, the process temperature is set to be less than 400 degrees C. (e.g., 350 degrees C.) in the second example. This prevents the disilane from being thermally decomposed, thus allowing the second seed layer 3 to be deposited only by the adsorption of silicon contained in the disilane without involving the CVD reaction growth. As a result, it is possible to prevent the second seed layer 3 from being formed thick in the area excluding the rod peripheral portions 20 as compared with the first example in which the second seed layer 3 is grown the CVD reaction.

In addition, in the formation of the silicon film 5 at the temperature of less than 400 degrees C. (e.g., 350 degrees C.), the growth of the silicon film 5 by the CVD reaction is slowed compared to the case of 400 degrees C., thus suppressing a speed of the CVD reaction in the area excluding the rod peripheral portions 20. On this account, it is possible to allow the film thickness of the silicon film 5 in the rod peripheral portions 20 to be relatively thickened with respect to that of the silicon film 5 in the area excluding the rod peripheral portions 20.

Further, according to the third example where the process temperature is 350 degrees C. and the process pressure is more than 133.3 Pa (e.g., 399.9 Pa) as shown in FIG. 7C, it is possible to form the silicon film 5 further thick in the rod peripheral portions 20, thus further improving the in-plane uniformity of the silicon film 5 in the silicon substrate 1, compared to the second example where the process temperature is 350 degrees C. and the process pressure is 133.3 Pa as shown in FIG. 7B. This is because the elevation in process pressure slows the velocity of the process gas flowing inside the support grooves 106a as shown in FIGS. 8A and 8B. By slowing the velocity of the process gas, it is possible to retain the process gas, e.g., the disilane gas used in the formation of the second seed layer 3, inside the support grooves 106a or in the vicinity thereof for a prolonged period of time. As the disilane is retained inside the support grooves 106a for a further prolonged period of time, the silicon contained in the disilane gas can be further adsorbed onto the first seed layer 2. Consequently, in the course of the film forming process, the silicon film 5 can be formed to have a relatively thick thickness in the rod peripheral portions 20 with respect to the area excluding the rod peripheral portions 20. For example, the silicon film 5 can be formed to have a substantially identical thickness both in the rod peripheral portions 20 and the area excluding the same.

(Dependence on Position of Boat of In-Plane Uniformity)

FIG. 5 shows the results that were obtained when the silicon substrate 1 is positioned at a middle stage of the vertical wafer boat 105 shown in FIG. 4. The in-plane uniformity of the silicon film 5 depends on a position of the silicon substrate 1 loaded in the vertical wafer boat 105. Next, an examination that was performed to check the dependence on position of boat of in-plane uniformity is described.

Figure 9:
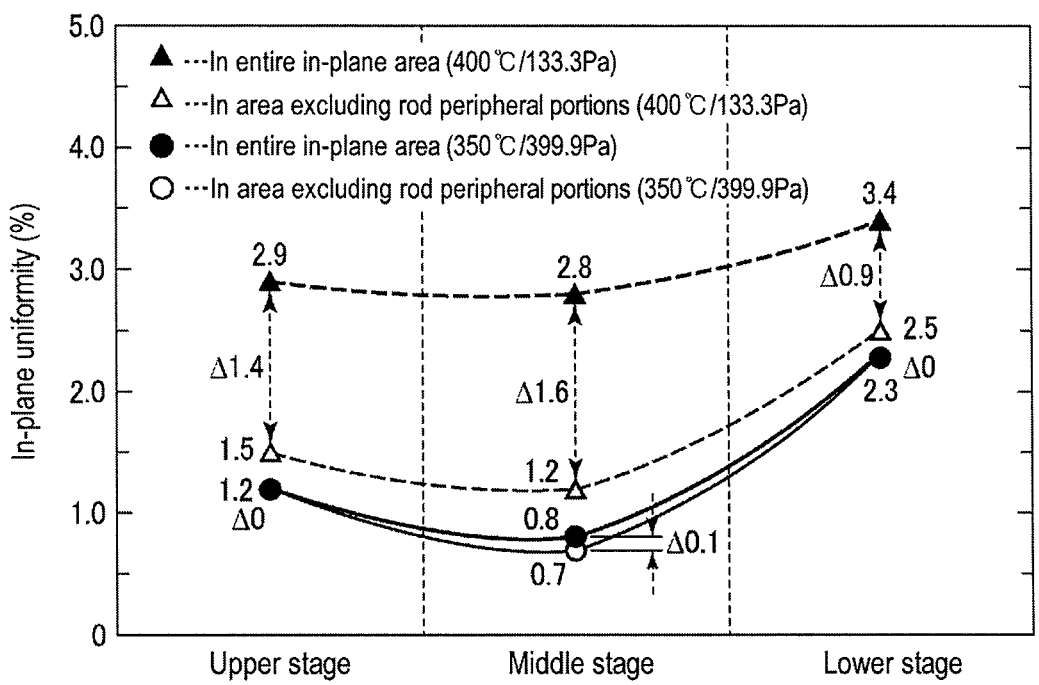
FIG. 9 is a view illustrating a relationship between a position of a boat and in-plane uniformity of the silicon film.

FIG. 9 is a view illustrating a relationship between a position of the wafer boat and the in-plane uniformity of the silicon film 5. In FIG. 9, the description of the relationship between the position of the wafer boat and the in-plane uniformity of the silicon film 5 will be given as to the first example (indicated by symbols "▲" and "△") and the third example (indicated by symbols "●" and "○") which were described with reference to FIG. 5.

First Example

Process Temperature of 400 Degrees C./Process Pressure of 133.3 Pa

<Upper Stage>

As shown in FIG. 9, in the first example, the in-plane uniformity in film thickness of the silicon film 5 over the entire in-plane area is about 2.9%, and the in-plane uniformity in film thickness of the silicon film 5 over the area excluding the rod peripheral portions 20 is about 1.5%. Thus, a difference therebetween is about 1.4%.

<Middle Stage>

As described with reference to FIG. 5, the in-plane uniformity in film thickness of the silicon film 5 over the entire in-plane area is about 2.8%, the in-plane uniformity in film thickness of the silicon film 5 over the area excluding the rod peripheral portions 20 is about 1.2%, and the difference therebetween is about 1.6%.

<Lower Stage>

The in-plane uniformity in film thickness of the silicon film 5 over the entire in-plane area is about 3.4% and the in-plane uniformity in film thickness of the silicon film 5 over the area excluding the rod peripheral portions 20 is about 2.5%. Thus, a difference therebetween is about 0.9%.

As can be seen from the above results, in the first example where the process temperature is 400 degrees C. and the process pressure is 133.3 Pa, the in-plane uniformity in film thickness of the silicon film 5 is hardly improved even as a function of the position of the wafer boat. In addition, the first example has shown that, regardless of the position of the wafer boat, there is a large difference between the film thickness of the silicon film 5 in the rod peripheral portions 20 and the film thickness of the silicon film 5 in the area excluding the rod peripheral portions 20.

Further, in the area excluding the rod peripheral portions 20 in the silicon film 5, the in-plane uniformity in film thickness thereof was examined to be better than the case of the entire in-plane area, but falls within the range of about 1.2% to about 2.5%.

Third Example

Process Temperature of 350 Degrees C./Process Pressure of 399.9 Pa

<Upper Stage>

In the third example, the in-plane uniformity in film thickness of the silicon film 5 over the entire in-plane area is about 1.2%, and the in-plane uniformity in film thickness of the silicon film 5 over the area excluding the rod peripheral portions 20 is also about 1.2%. Thus, a difference therebetween is about 0%. That is, the film thicknesses of the silicon film 5 in both areas are substantially identical to each other.

<Middle Stage>

As described with respect to FIG. 5, the in-plane uniformity in film thickness of the silicon film 5 over the entire in-plane area is about 0.8%, the in-plane uniformity in film thickness of the silicon film 5 over the area excluding the rod peripheral portions 20 is about 0.7%, and the difference therebetween is about 0.1%. That is, the film thicknesses of the silicon film 5 in both areas are substantially identical to each other.

<Lower Stage>

The in-plane uniformity in film thickness of the silicon film 5 over the entire in-plane area is about 2.3%, and the in-plane uniformity in film thickness of the silicon film 5 over the area excluding the rod peripheral portions 20 is also about 2.3%. Thus, a difference therebetween is about 0%. That is, the film thicknesses of the silicon film 5 in both areas are substantially identical to each other.

As can be seen from the above results, in the third example where the process temperature is 350 degrees C. and the process pressure is 399.9 Pa, the difference between the in-plane uniformity of the silicon film 5 over the entire in-plane area and the in-plane uniformity of the silicon film 5 over the area excluding the rod peripheral portions 20 has hardly changed as a function of the position of the wafer boat. That is, it is possible to substantially reduce or eliminate the difference between the film thicknesses of the silicon film 5 over both the rod peripheral portions 20 and the area excluding the rod peripheral portions 20, regardless of the position of the wafer boat.

Further, the in-plane uniformity in film thickness of the silicon film 5 over the area excluding the rod peripheral portions 20 is improved up to a range of about 0.7 to 2.3%, as compared with the first example.

As described above, the silicon film forming method and the seed layer forming method according to the first and second embodiments are capable of meeting the request for further reduction in temperature of the film forming process.

Further, the silicon film forming method and the seed layer forming method according to the first and second embodiments are capable of maintaining and further improving the accuracy of the surface roughness of the thin film formed on the dual seed layer 4.

Next, an example of a film forming apparatus according to a third embodiment of the present disclosure will be described, which is capable of performing the silicon film forming method and the seed layer forming method according to the first and second embodiments of the present disclosure.

<Film Forming Apparatus>

Figure 10:
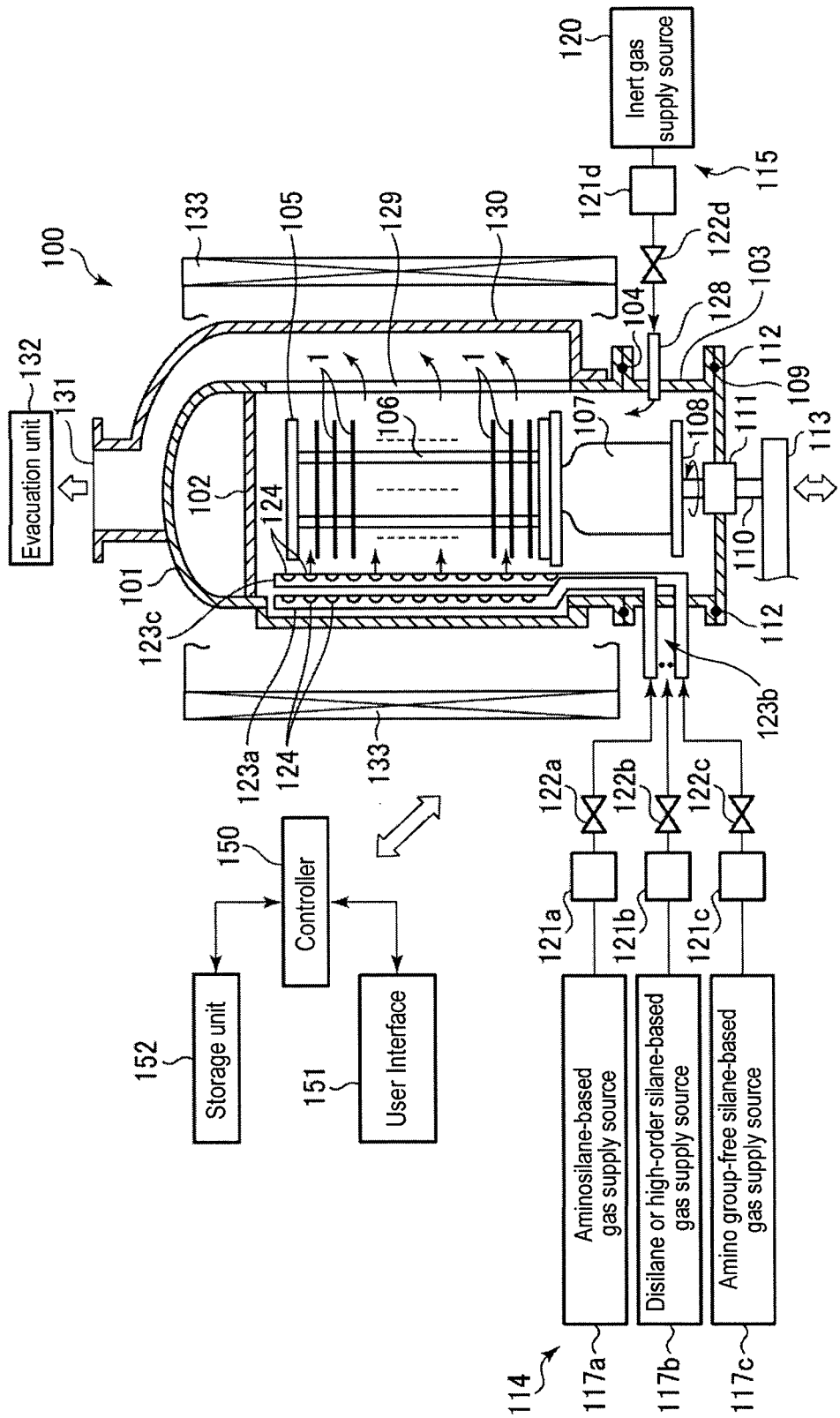
FIG. 10 is a view schematically showing an example of a film forming apparatus according to a third embodiment of the present disclosure.

FIG. 10 is a sectional view schematically showing the film forming apparatus according to the third embodiment of the present disclosure.

As shown in FIG. 10, a batch type film forming apparatus 100, which processes a plurality of substrates at once, includes a cylindrical processing chamber 101 having a ceiling with a bottom end opened. The entirety of the processing chamber 101 is formed of, for example, quartz. A quartz ceiling plate 102 is installed at the ceiling in the processing chamber 101. A manifold 103 formed of, for example, a stainless steel in a cylindrical shape is connected to a bottom opening of the processing chamber 101 through a seal member 104 such as an O ring.

The manifold 103 supports the bottom end of the processing chamber 101. The vertical wafer boat 105 described with reference to FIG. 4, is inserted from the bottom of the manifold 103 into the processing chamber 101. The vertical wafer boat 105 includes the plurality of wafer rods 106 which is formed with the plurality of support grooves 106a (see FIG. 4B). Each of the plurality of support grooves 106a is partially configured to support some portions of the periphery of each of the plurality of (e.g., 50 to 100) semiconductor substrates (the silicon substrates 1 in the above embodiments) as objects to be processed. Thus, the plurality of silicon substrates 1 is mounted on the vertical wafer boat 105 in multi stages.

The vertical wafer boat 105 is mounted on a table 108 through a heat insulating tube 107 of quartz. The table 108 is supported on a rotation axis 110 that passes through a cover part 109, which is made of, e.g., a stainless steel, and opens or closes a lower end opening portion of the manifold 103. A magnetic fluid seal 111 is disposed at a through portion of the rotation axis 110. The magnetic fluid seal 111 closely seals and rotatably supports the rotation axis 110. Also, for example, a seal member 112 of the O-ring is disposed between a peripheral portion of the cover portion 109 and a lower end portion of the manifold 103, thus maintaining sealability in the processing chamber 101. The rotation axis 110, for example, is disposed at a front end of an arm 113 that is supported by an ascending/descending instrument (not shown) such as a boat elevator. The rotation axis 110 ascends or descends the wafer boat 105 and the cover part 109 integratedly, and is inserted into or detached from the processing chamber 101.

The film forming apparatus 100 includes a process gas supply mechanism 114 configured to supply a process gas into the processing chamber 101, and an inert gas supply mechanism 115 configured to supply an inert gas into the processing chamber 101.

The process gas supply mechanism 114 of this embodiment includes an aminosilane-based gas supply source 117a, a source 117b configured to supply a disilane or a higher order silane-based gas (hereinafter, referred to as a "higher order silane-based gas supply source 117b"), and a source 117c configured to supply a silane-based gas containing no amino group (hereinafter, referred to as a "silane-based gas supply source 117c").

In addition, the inert gas supply mechanism 115 includes an inert gas supply source 120. The aminosilane-based gas is used in forming the first seed layer 2. An example of the aminosilane-based gas may include DIPAS. The disilane or higher order silane-based gas is used in forming the second seed layer 3. An example of the disilane or higher order silane-based gas may include disilane ($Si_2H_6$). The amino group-free silane-based gas is used in forming the silicon film 5. An example of the amino group-free silane-based gas may include disilane ($Si_2H_6$). An example of the inert gas may include a nitrogen gas. The inert gas is used as a purge gas or the like.

The aminosilane-based gas supply source 117a is connected to a dispersing nozzle 123a via a flow rate controller 121a and an on-off valve 122a. Similarly, the higher order silane-based gas supply source 117b is connected to a dispersing nozzle 123b (shown only reference numeral in FIG. 10 for the sake of simplicity) via a flow rate controller 121b and an on-off valve 122b. Similarly, the silane-based gas supply source 117c is connected to a dispersing nozzle 123c via a flow rate controller 121c and an on-off valve 122c.

The dispersing nozzles 123a to 123c, which are made of quartz pipes, penetrate a sidewall of the manifold 103 inward, bend upward and extend vertically. At vertical portions of the dispersing nozzles 123a to 123c, a plurality of gas discharge holes 124 is formed spaced apart from each other at predetermined vertical intervals. With this configuration, the aforementioned gases are discharged in an approximately uniform manner from the respective gas discharge holes 124 into the processing chamber 101 in the horizontal direction.

The inert gas supply source 120 is connected to a nozzle 128 via a flow rate controller 121d and an on-off valve 122d. The nozzle 128 penetrates the sidewall of the manifold 103, and discharges the inert gas from its leading end into the processing chamber 101 in the horizontal direction.

At a portion opposite to the dispersing nozzles 123a to 123c in the processing chamber 101, an exhaust vent 129 is formed to exhaust the processing chamber 101. The exhaust vent 129 has an elongated shape formed by vertically chipping the sidewall of the processing chamber 101. At a portion corresponding to the exhaust vent 129 of the processing chamber 101, an exhaust vent cover member 130 with a C-shaped section is installed by welding to cover the exhaust vent 129. The exhaust vent cover member 130 extends upward along the sidewall of the processing chamber 101, and defines a gas outlet 131 at the top of the processing chamber 101. An exhaust mechanism 132 equipped with a vacuum pump and the like is connected to the gas outlet 131. The exhaust mechanism 132 exhausts a process gas from the processing chamber 101 and changes an internal pressure of the processing chamber 101 into a designed process pressure.

A cylindrical body-shaped heating device 133 is installed on the outer periphery of the processing chamber 101. The heating device 133 activates gas supplied into the processing chamber 101, and heats the objects to be processed (e.g., the silicon substrates 1 in this embodiment) loaded in the processing chamber 101.

For example, respective components of the film forming apparatus 100 are controlled by a controller 150 including a microprocessor (e.g., a computer). The controller 150 is connected to a user interface 151 including a touchpad for inputting, by an operator, a command to control the film forming apparatus 100, and a display unit for displaying an operation state of the film forming apparatus 100.

A memory unit 152 is connected to the controller 150. The memory unit 152 stores a control program for executing various processes in the film forming apparatus 100 under the control of the controller 150, and a program (i.e., a recipe) for executing a process in the respective component of the film forming apparatus 100 according to the process conditions. For example, the recipe is stored in a memory medium of the memory unit 152. The memory medium may include a hard disk, a semiconductor memory, a CD-ROM, a DVD, and a portable memory such as a flash memory. The recipe may be suitably transmitted from other device through a dedicated line. If necessary, the recipe is read from the memory unit 152 in response to a command received from the user interface 151, and the controller 150 executes a process according to the read recipe. With this configuration, the film forming apparatus 100 performs a desired process under the control of the controller 150.

In the third embodiment, the film forming processes of the silicon film forming method according to the second embodiment are sequentially executed under the control of the controller 150.

The silicon film forming method and the seed layer forming method according to the first and second embodiments may be performed using a single film forming apparatus such as the film forming apparatus 100 shown in FIG. 10.

Also, while in the above embodiment, the film forming apparatus 100 shown in FIG. 10 has been described to be configured as the batch type one, but is not limited thereto. Alternatively, the film forming apparatus 100 may be configured as a single wafer type.

While some embodiments have been described, the present disclosure is not limited thereto and may be modified in various ways.

For example, while specific process conditions are illustrated in the above embodiments, the process conditions are not limited thereto and may be modified according to the size of the silicon substrate 1, a variation in capacity of the processing chamber 101 or the like without degrading the aforementioned effects.

In addition, according to the film forming method described in the above embodiments, it is possible to improve the in-plane uniformity in film thickness of the silicon film 5 and also, further improve the accuracy of the surface roughness of the silicon film 5 by shortening the incubation time, even when performing the film forming process at a low temperature, e.g., the temperature of less than 400 degrees C. as the upper limit. Accordingly, the film forming method described in the above embodiments may be effectively applied to a method of manufacturing an electronic product which is further miniaturized, for example, a process of manufacturing a semiconductor device or a flat panel display.

In addition, thickening the thickness of the dual seed layer 4 including the first seed layer 2 followed by the second seed layer 3 causes an increase in thickness of the silicon film 5 (including the thickness of the dual seed layer 4). Because of this, in terms of thinning the silicon film 5, it is preferable that the first seed layer 2 is formed to have a thinned thickness. As an example, the first seed layer 2 may have a thickness of a monoatomic layer level. As described above, it is preferable that a specific thickness of the dual seed layer 4 is set to be a finite value in the range of more than 0 nm to not more than 1.0 nm.

As described above, the silicon film forming method according to the first and second embodiments is capable of further improving the incubation time, which makes it possible to further enhance the accuracy of the surface roughness of the silicon film. In the light of the foregoings, the silicon film forming method may be effectively applied even in the formation of the silicon film 5 having a relatively thick thickness. As an example, the silicon film forming method may be applied even when the silicon film 5 is formed to have a thickness in the range of 50 nm to 100 nm, which is being generally employed in manufacturing semiconductor devices. Further, the silicon film forming method may be applied even when for the silicon film 5 is formed to have a further thinned thickness, e.g., in the range of more than 2 nm to less than 50 nm.

In some embodiments, the aminosilane-based gas may be adsorbed onto the silicon substrate 1 (used as the underlayer) without being decomposed. As an example, DIPAS may be thermally decomposed at a temperature of 450 degrees C. or greater. When the aminosilane-based gas is thermally decomposed, impurities such as carbon (C), nitrogen (N) or the like may be sometimes introduced into a formed film. By allowing the aminosilane-based gas to be adsorbed onto the silicon substrate 1 (used as the underlayer) without being decomposed, it is possible to prevent the impurities from being introduced into the formed film.

Further, in the above embodiments, the process pressure applied in forming the first seed layer 2 and the second seed layer 3 has been described to be set to more than 133.3 Pa (1 Torr) in terms of the improvement of in-plane uniformity of the silicon film 5. The specific example of the process pressure was 399.9 Pa (3 Torr). In some embodiments, the upper limit of the process pressure that is applied in forming the first seed layer 2 and the second seed layer 3 may be set to equal to or less than 1333 Pa (10 Torr).

According to the present disclosure, it is possible to provide a seed layer forming method, a silicon film forming method using the same, and a film forming apparatus for use in the silicon film forming method, which are capable of meeting a request for further reduction in temperature of a film forming process, maintaining and improving accuracy of a surface roughness of a thin film formed on a seed layer, and further improving in-plane uniformity of the thin film.

While certain embodiments have been described, these embodiments have been presented by way of example only, and are not intended to limit the scope of the disclosures. Indeed, the novel methods and apparatuses described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a seed layer as a seed of a thin film on an underlayer, the method comprising:
   forming a first seed layer on a surface of the underlayer by heating the underlayer, followed by supplying an aminosilane-based gas onto the surface of the heated underlayer to adsorb at least the silicon contained in the aminosilane-based gas onto the surface; and forming a second seed layer on the surface of the underlayer with the first seed layer formed thereon by heating the underlayer, followed by supplying a disilane or higher order silane-based gas onto the surface of the heated underlayer to adsorb at least the silicon contained in the disilane or higher order silane-based gas onto the surface, wherein a process temperature applied when forming the first seed layer is set to be within a range between less than 400 degrees C. and not less than a temperature at which at least silicon contained in the aminosilane-based gas is adsorbed onto the surface of the underlayer, and wherein a process temperature applied in forming the second seed layer is set to be within a range between less than 400 degrees C. and not less than a temperature at which at least silicon contained in the disilane or higher order silane-based gas is adsorbed onto the surface of the underlayer with the first seed layer formed thereon.

2. The method of claim 1, wherein the adsorption of at least the silicon in forming a first seed layer and the adsorption of at least the silicon in forming a second seed layer are performed without involving a chemical vapor deposition (CVD) reaction, respectively.

3. The method of claim 1, wherein the adsorption of at least the silicon in forming a first seed layer and the adsorption of at least the silicon in forming a second seed layer are performed such that the silicon is adsorbed onto the surface to have a thickness in a range of more than 0 nm to not more than 1 nm, respectively.

4. The method of claim 3, wherein the seed layer including the first seed layer and the second seed layer has a thickness in a range of more than 0 nm to not more than 1 nm.

5. The method of claim 4, wherein the adsorption of at least the silicon in forming a first seed layer and the adsorption of at least the silicon in forming a second seed layer are performed such that the silicon is adsorbed onto the surface to have a thickness of a monoatomic layer level, respectively.

6. The method of claim 1, wherein the seed layer including the first seed layer and the second seed layer is amorphous.

7. The method of claim 1, wherein a process pressure in forming a second seed layer is in a range of more than 133.3 Pa to not more than 1333 Pa.

8. The method of claim 1, wherein the aminosilane-based gas is gas containing at least one selected from a group consisting of:
butylaminosilane,
bis(tertiary-butylamino)silane,
dimethylaminosilane,
bisdimethylaminosilane,
tri(dimethylamino)silane,
diethylaminosilane,
bis(diethylamino)silane,
dipropylaminosilane,
diisopropylaminosilane, and
hexakis(ethylamino)disilane:

(here, n is the number of amino groups, which is a natural number of 1 to 6, m is the number of alkyl groups, which is zero or a natural number of 1 to 5,

R1, R2, R3=$CH_3$, $C_2H_5$, $C_3H_7$,

R1, R2 and R3 is equal to each other, or is not equal to each other,

R3 is Cl or F, and

X is a natural number of 1 or higher).

9. The method of claim 1, wherein the disilane or higher order silane-based gas is a gas containing at least one selected from a group consisting of:

silicon hydride represented by formula $Si_mH_{2m+2}$ (here, m is a natural number of 2 or greater), and silicon hydride represented by formula $Si_nH_{2n}$ (here, n is a natural number of 3 or greater).

10. The method of claim 9, wherein the silicon hydride represented by the formula $Si_mH_{2m+2}$ is at least one selected from a group consisting of:
disilane ($Si_2H_6$),
trisilane ($Si_3H_8$),
tetrasilane ($Si_4H_{10}$),
pentasilane ($Si_5H_{12}$),
hexasilane ($Si_6H_{14}$), and
heptasilane ($Si_7H_{16}$), and wherein the silicon hydride represented by the formula $Si_nH_{2n}$ is at least one selected from a group consisting of:
cyclotrisilane ($Si_3H_6$),
cyclotetrasilane ($Si_4H_8$),
cyclopentasilane ($Si_5H_{10}$),
cyclohexasilane ($Si_6H_{12}$), and
cycloheptasilane ($Si_7H_{14}$).

11. A method of forming a silicon film on an object to be processed, the method comprising:

forming a seed layer on a surface of an underlayer of the object to be processed; and forming the silicon film on the seed layer, wherein forming a seed layer is performed using the method of claim 1.

* * * * *